United States Patent
Heo et al.

(10) Patent No.: US 9,136,336 B2
(45) Date of Patent: Sep. 15, 2015

(54) INVERTER LOGIC DEVICES INCLUDING GRAPHENE FIELD EFFECT TRANSISTOR HAVING TUNABLE BARRIER

(75) Inventors: Jin-seong Heo, Suwon-si (KR); Seong-jun Park, Seoul (KR); Hyun-jong Chung, Hwaseong-si (KR); Hyun-jae Song, Hwaseong-si (KR); Hee-jun Yang, Seoul (KR); David Seo, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/593,708

(22) Filed: Aug. 24, 2012

(65) Prior Publication Data

US 2013/0048948 A1 Feb. 28, 2013

(30) Foreign Application Priority Data

Aug. 26, 2011 (KR) .................... 10-2011-0085818

(51) Int. Cl.
*H01L 27/085* (2006.01)
*H01L 29/16* (2006.01)
*H01L 29/66* (2006.01)
*B82Y 10/00* (2011.01)
*H01L 29/786* (2006.01)
*H01L 27/092* (2006.01)
*H01L 21/8238* (2006.01)

(52) U.S. Cl.
CPC ............ *H01L 29/1606* (2013.01); *B82Y 10/00* (2013.01); *H01L 27/092* (2013.01); *H01L 29/66045* (2013.01); *H01L 29/78684* (2013.01); *H01L 21/823807* (2013.01)

(58) Field of Classification Search
USPC ................... 257/E21.632, E21.633
See application file for complete search history.

(56) References Cited

U.S. PATENT DOCUMENTS

| | | | |
|---|---|---|---|
| 8,227,794 B2 * | 7/2012 | Otsuji et al. ............ | 257/29 |
| 2010/0102292 A1 | 4/2010 | Hiura et al. | |
| 2010/0258787 A1 * | 10/2010 | Chae et al. ............ | 257/39 |
| 2011/0156007 A1 * | 6/2011 | Otsuji et al. ............ | 257/29 |
| 2012/0181509 A1 * | 7/2012 | Liang et al. ............ | 257/29 |
| 2012/0256168 A1 * | 10/2012 | Lee et al. ............ | 257/27 |
| 2012/0261645 A1 * | 10/2012 | Cho et al. ............ | 257/29 |

FOREIGN PATENT DOCUMENTS

| | | |
|---|---|---|
| JP | 2007335532 A | 12/2007 |
| JP | 2010062358 A | 3/2010 |
| KR | 20110050621 A | 5/2011 |

OTHER PUBLICATIONS

Traversi et al. Integrated complementary graphene inverter. Jun. 5, 2009. Applied Physics Letters 94, 223312.*
Song-Lin Li, et al., "Low Operating Bias and Matched Input-Output Characteristics in Graphene Logic Converters," *Nano Lett.*, vol. 10, pp. 2357-2362 (2010).

* cited by examiner

*Primary Examiner* — Zandra Smith
*Assistant Examiner* — Molly Reida
(74) *Attorney, Agent, or Firm* — Harness, Dickey & Pierce

(57) ABSTRACT

Inverter logic devices include a gate oxide on a back substrate, a first graphene layer and a second graphene layer separated from each other on the gate oxide, a first electrode layer and a first semiconductor layer separated from each other on the first graphene layer, a second electrode layer and a second semiconductor layer separated from each other on the second graphene layer, and an output electrode on the first and second semiconductor layers and configured to output an output signal. The first semiconductor layer is doped with a different type of impurities selected from n-type impurities and p-type impurities than the second semiconductor layer.

8 Claims, 6 Drawing Sheets

INVERTER LOGIC DEVICES INCLUDING GRAPHENE FIELD EFFECT TRANSISTOR HAVING TUNABLE BARRIER

CROSS-REFERENCE TO RELATED APPLICATIONS

This application claims the benefit of priority under 35 U.S.C. §119 from Korean Patent Application No. 11-2011-0085818, filed on Aug. 26, 2011, in the Korean Intellectual Property Office, the disclosure of which is incorporated herein by reference in its entirety.

BACKGROUND

1. Field

Example embodiments relate to inverter logic devices including a field effect transistor having a tunable semiconductor barrier.

2. Description of the Related Art

Graphene having a 2-dimensional hexagonal carbon structure has been actively developed throughout the world as a new material for replacing a semiconductor. In particular, when graphene that is a zero gap semiconductor is manufactured as a graphene nanoribbon (GNR) having a channel width of not more than 10 nm, a bandgap is formed due to a size effect so that a field effect transistor capable of operating at room temperature may be manufactured.

However, when a transistor using the GNR as a channel is manufactured, although an on/off ratio of the transistor is improved, mobility is considerably deteriorated due to a disordered edge and on-current is low. To address this problem, a bandgap may be formed by applying an electric field to a bilayered graphene in a perpendicular direction. However, this method is a large size CVD method and thus it is difficult to grow uniform bilayered graphene and to be commercialized due to a random domain.

SUMMARY

Example embodiments relate to inverter logic devices including a field effect transistor having a tunable semiconductor barrier.

Additional aspects will be set forth in part in the description which follows and, in part, will be apparent from the description, or may be learned by practice of the presented example embodiments.

According to example embodiments, an inverter logic device includes a gate oxide on a back substrate, a first graphene layer and a second graphene layer separated from each other on the gate oxide, a first electrode layer and a first semiconductor layer separated from each other on the first graphene layer, a second electrode layer and a second semiconductor layer separated from each other on the second graphene layer, wherein the first semiconductor layer is doped with a different type of impurities selected from n-type impurities and p-type impurities than the second semiconductor layer, and an output electrode on the first semiconductor layer and the second semiconductor layer and configured to output an output signal.

The inverter logic device may include a third electrode connected to the first semiconductor layer and facing the first graphene layer, and a fourth electrode connected to the second semiconductor layer and facing the second graphene layer. The output electrode may be connected to the third electrode and the fourth electrode.

The first semiconductor layer and the second semiconductor layer may be connected to each other or arranged close to each other, and the third electrode and the fourth electrode may be integrally formed as a common electrode on the first semiconductor layer and the second semiconductor layer.

The output electrode may be integrally connected to the common electrode.

The first graphene layer and the second graphene layer may be respectively separated from the third electrode and the fourth electrode.

Each of the first semiconductor layer and the second semiconductor layer may include one selected from the group consisting of silicon, germanium, silicon-germanium, III-V group semiconductors, II-VI group semiconductors and combinations thereof.

Each of the first semiconductor layer and the second semiconductor layer may have a thickness of about 1 nm-about 10 nm.

Energy gaps of the first semiconductor layer and the second semiconductor layer may vary according to a gate voltage applied to the back gate substrate.

According to example embodiments, an inverter logic device includes a first well on a conductive substrate and doped with first impurities, a second well doped with second impurities having a polarity different from a polarity of the first impurities, a first graphene layer covering the first well, a second graphene layer covering the second well and separated from the first graphene layer, wherein the first and second graphene layers are insulated from the conductive substrate, a first electrode on the first graphene layer to face the first insulation layer, a second electrode on the second graphene layer to face the second insulation layer, a gate oxide covering the first graphene layer and the second graphene layer, and a gate electrode on the gate oxide to face the first well and the second well.

The inverter logic device may include a first insulation layer on the conductive substrate to correspond to the first well, wherein the first graphene layer covers the first insulation layer, and a second insulation layer on the conductive substrate to correspond to the second well, wherein the second graphene layer covers the second insulation layer.

Each of the conductive substrate and the first and second wells may include one selected from the group consisting of silicon, germanium, silicon-germanium, III-V group semiconductors, II-VI group semiconductors and combinations thereof.

The conductive substrate may be doped with the first impurities.

The gate electrode may be configured to receive an input signal, and the conductive substrate may be configured to output an output signal.

The conductive substrate may be separated from the first graphene layer and the second graphene layer.

Energy gaps of the first well and the second well may vary according to a voltage applied to the gate electrode.

Each of the first graphene layer and the second graphene layer may include a single layer to four layers of graphene.

Each of the first well and the second well may have a thickness of about 1 nm-about 10 nm.

BRIEF DESCRIPTION OF THE DRAWINGS

These and/or other example embodiments will become apparent and more readily appreciated from the following description of the example embodiments, taken in conjunction with the accompanying drawings of which.

DETAILED DESCRIPTION

Figure 1:
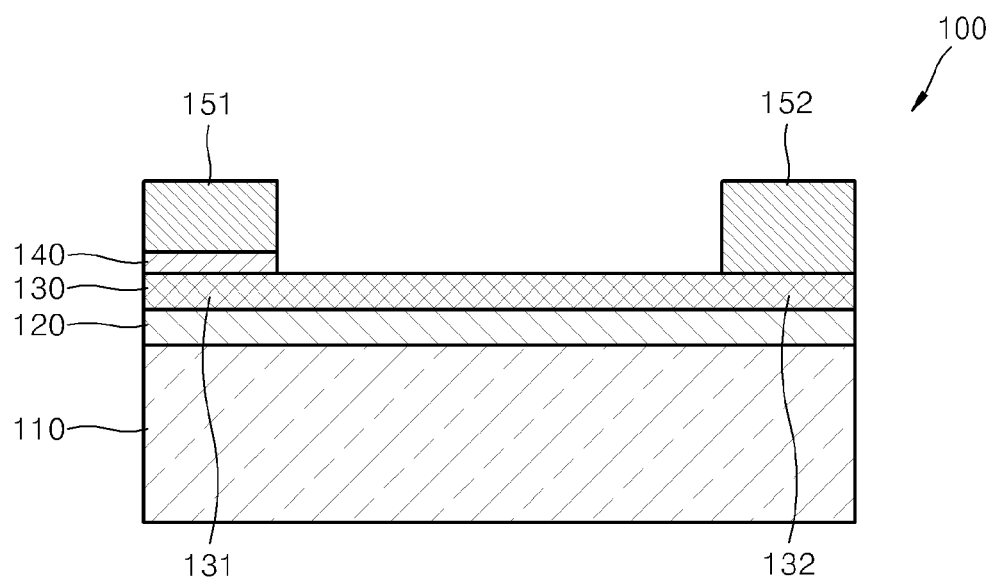
FIG. 1 is a cross-sectional view schematically illustrating a graphene switching device including a tunable barrier having a semiconductor barrier according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to inverter logic devices including a field effect transistor having a tunable semiconductor barrier.

FIG. 1 is a cross-sectional view schematically illustrating a graphene switching device including a tunable barrier having a semiconductor barrier according to example embodiments.

Referring to FIG. 1, a gate oxide 120 is formed on a substrate 110. A graphene layer 130 is formed on the gate oxide 120. A semiconductor layer 140 is formed on a first region of the graphene layer 130. A first electrode 151 is formed on the semiconductor layer 140. A second electrode 152 is formed on a second region of the graphene layer 130 that is separated from the first region.

The first electrode 151 and the second electrode 152 may be a source electrode and a drain electrode, or vice versa. The first electrode 151 and the second electrode 152 may be formed of metal or polysilicon.

The substrate 110 may function as a back gate and be formed of a semiconductor substrate doped with impurities or metal. The gate oxide 120 may be formed of silicon oxide or silicon nitride.

The graphene layer 130 may be formed by transferring and patterning graphene that is manufactured by chemical vapor deposition (CVD). The graphene layer 130 may include a single layer to four layers of graphene. The graphene layer 130 is a path through which carriers are transferred, and may have a zero band gap.

The semiconductor layer 140 may be formed of silicon, germanium, silicon-germanium, III-V group semiconductors, II-VI group semiconductors or combinations thereof. The semiconductor layer 140 may have a thickness sufficient for tunneling of carriers. Although the thickness of the semiconductor layer 140 varies according to a material thereof, the thickness may be about 1 nm-about 10 nm. The semiconductor layer 140 may be doped with any one of dopants of n-type impurities or p-type impurities. The semiconductor layer 140 is arranged to face a gate electrode (substrate 110) with the graphene layer 130 interposed therebetween as illustrated in FIG. 1. An energy gap of the semiconductor layer 140 may be adjusted by a gate voltage. Thus, the semiconductor layer 140 is a tunable barrier and may be referred to as a semiconductor barrier.

The graphene switching device 100 including a tunable barrier may be a unipolar transistor that is an n-type transistor or a p-type transistor according to the polarity of the semiconductor layer 140. That is, when the semiconductor layer 140 is doped with n-type impurities, the graphene switching device 100 including a tunable barrier becomes an n-type transistor. When the semiconductor layer 140 is doped with p-type impurities, the graphene switching device 100 including a tunable barrier becomes a p-type transistor. In the following description, the graphene switching device 100 is referred to as a graphene field effect transistor.

FIGS. 2A-2D are energy band diagrams for explaining an operation of the graphene switching device of FIG. 1.

Figure 2A:
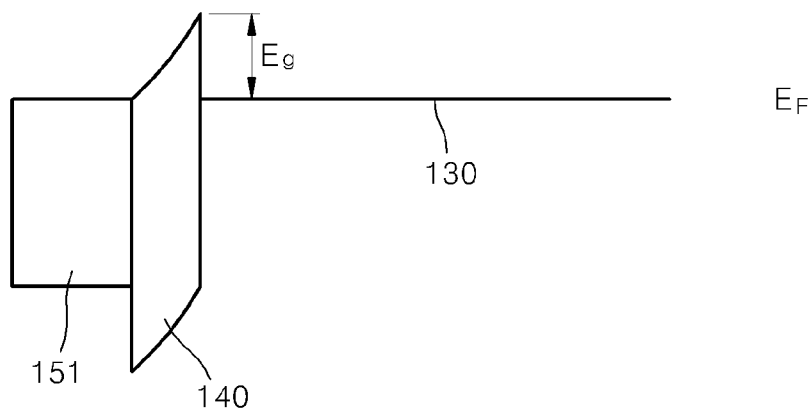
FIGS. 2A-2D are energy band diagrams for explaining an operation of the graphene switching device of FIG. 1.
Figure 2B:
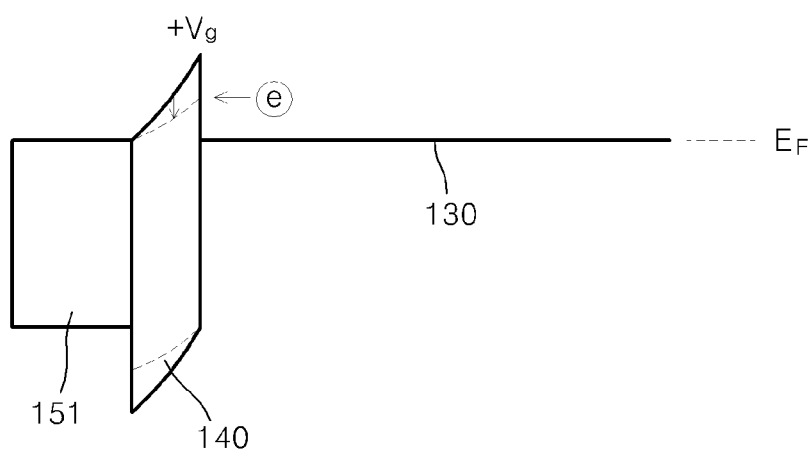

FIGS. 2A and 2B illustrate an operation of an n-type graphene switching device.

In detail, FIG. 2A illustrates a state before a gate voltage is applied. FIG. 2B illustrates a state when a gate voltage is applied to the gate (substrate).

Referring to FIG. 2A, in a state in which a gate voltage is not applied to the substrate 110 that is a gate electrode, an energy band structure is formed at both sides of the semiconductor layer 140 corresponding to work functions of the graphene layer 130 and the first electrode 151. Because the graphene switching device 100 includes the semiconductor layer 140 that is an n-type, main carriers are electrons. The semiconductor layer 140 between the first electrode 151 and the graphene layer 130 works as an energy barrier therebetween. In example embodiments, the semiconductor layer 140 is referred to as a semiconductor barrier. The transfer of carriers is limited by energy gap $E_g$ between the graphene layer 130 and the semiconductor layer 140. In FIGS. 2A and 2B, $E_F$ denotes a Fermi energy level of the graphene layer 130.

Referring to FIG. 2B, in a state in which a given voltage is applied to the first electrode 151 and the second electrode 152, when a given positive gate voltage $+V_g$ is applied to the substrate 110 that is a back gate, the energy gap $E_g$ of the semiconductor layer 140 is lowered as illustrated by a dotted line. Thus, electrons are easily transferred to the first electrode 151 from the graphene layer 130. This means that current flows in the graphene switching device 100 by a gate voltage. Thus, the graphene switching device 100 works as a field effect transistor. The graphene layer 130 is a path for carriers, which is distinguished from a channel of a typical field effect transistor.

The electrons may be transferred by passing through the semiconductor layer 140 due to a tunneling effect of the semiconductor layer 140 generated by a decrease in the energy gap $E_g$.

As the gate voltage increases, the energy gap $E_g$ of the semiconductor layer 140 is further lowered. Thus, the energy gap $E_g$ of the semiconductor layer 140 is adjustable.

Figure 3:
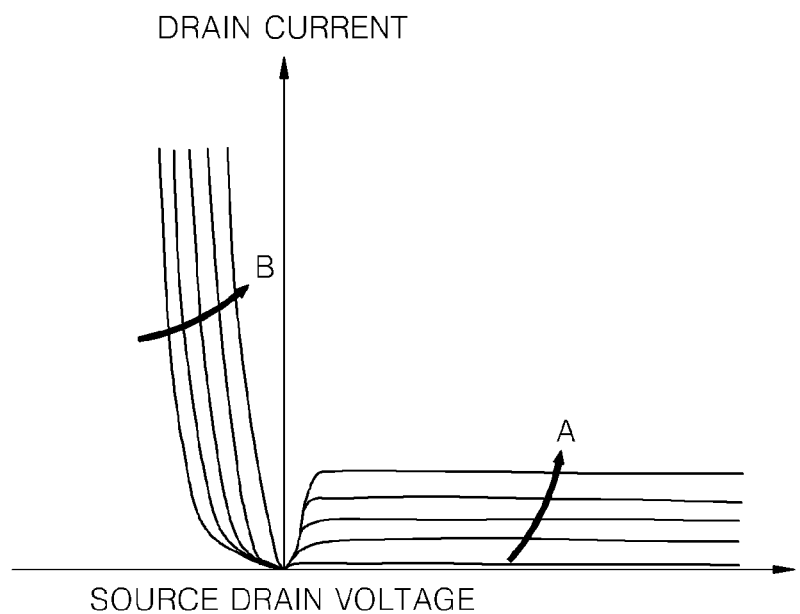
FIG. 3 is an I-V graph of an n-type graphene switching device according to example embodiments.

FIG. 3 is an I-V graph of an n-type graphene switching device according to example embodiments.

Referring to FIG. 3, when a source-drain voltage is positive, as a gate voltage increases, the energy gap decreases so that drain current increases in a direction indicated by an arrow A.

In FIGS. 2A and 2B, when a negative voltage is applied to the first electrode 151 of the graphene switching device 100 including the semiconductor layer 140 that is an n-type, electrons flow well without the energy barrier. When a positive voltage is applied to the first electrode 151, current does not flow well due to the energy barrier. Thus, the graphene switching device 100 functions as a diode. Because the amount of the energy barrier is adjusted as the gate voltage increases, current increases in a direction indicated by an arrow B so that a diode characteristic may be adjusted.

Figure 2C:
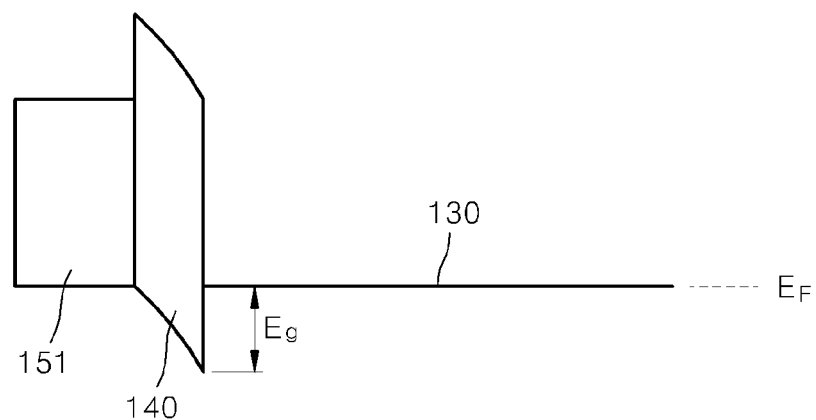
Figure 2D:
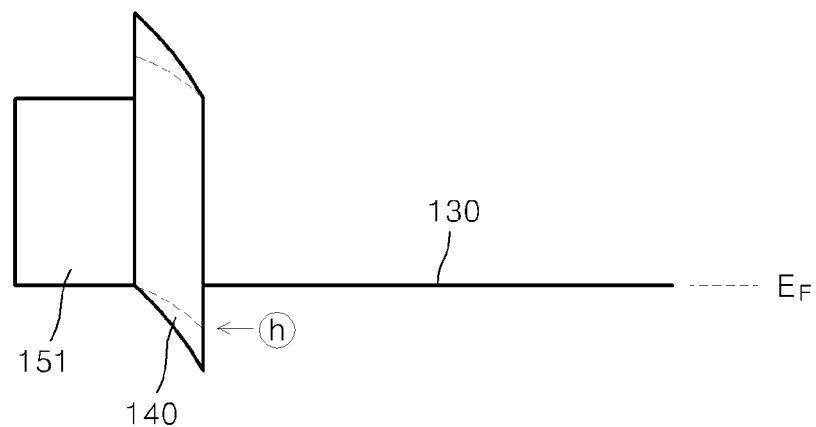

FIGS. 2C and 2D illustrate an operation of a p-type graphene switching device.

In detail, FIG. 2C illustrates a state before a gate voltage is applied. FIG. 2D illustrates a state when a gate voltage is applied to the gate (substrate).

Referring to FIG. 2C, in a state in which a gate voltage is not applied to the substrate 110 that is a gate electrode, an energy band structure is formed at both sides of the semiconductor layer 140 corresponding to work functions of the graphene layer 130 and the first electrode 151. Because the graphene switching device 100 includes the semiconductor layer 140 that is a p-type, main carriers are holes. The semiconductor layer 140 between the first electrode 151 and the graphene layer 130 works as an energy barrier therebetween. The transfer of carriers is limited by the energy gap $E_g$ between the graphene layer 130 and the semiconductor layer 140. In FIGS. 2C and 2D, $E_F$ denotes a Fermi energy level of the graphene layer 130.

Referring to FIG. 2D, in a state in which a given voltage is applied to the first electrode 151 and the second electrode 152, when a given negative gate voltage $(-V_g)$ is applied to the substrate 110 that is a back gate, the energy gap $E_g$ of the semiconductor layer 140 decreases as indicated by a dotted line. Thus, holes are easily transferred to the first electrode 151 from the graphene layer 130. This means that current flows in the graphene switching device 100 by the gate voltage. Thus, the graphene switching device 100 works as a field effect transistor.

The holes may be transferred by passing through the semiconductor layer 140 due to a tunneling effect of the semiconductor layer 140 generated by a decrease in the energy gap $E_g$.

As the gate voltage increases, the energy gap $E_g$ of the semiconductor layer 140 is further lowered. Thus, the energy gap $E_g$ of the semiconductor layer 140 is adjustable.

Figure 4:
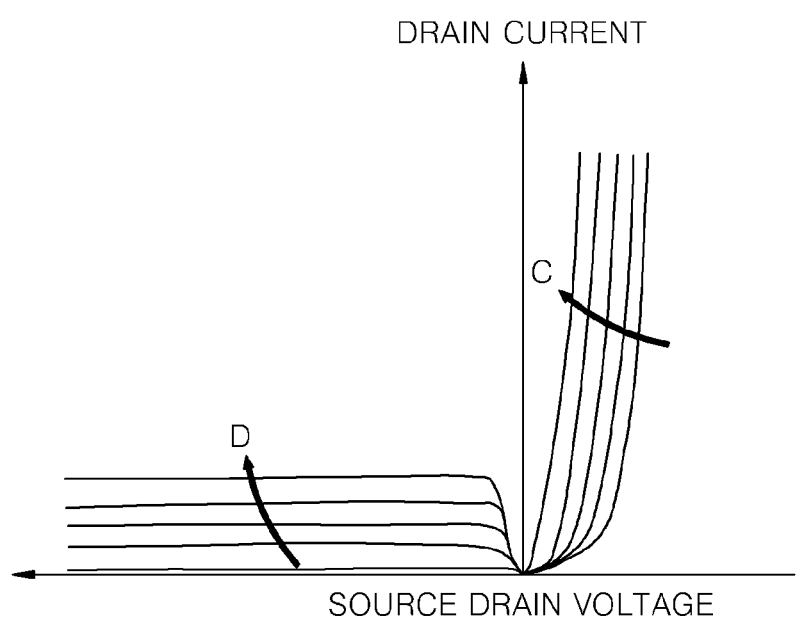
FIG. 4 is an I-V graph of a p-type graphene switching device according to example embodiments.

FIG. 4 is an I-V graph of a p-type graphene switching device according to example embodiments.

Referring to FIG. 4, when a source-drain voltage is negative, as the gate voltage increases, the energy gap decreases so that drain current increases in a direction indicated by an arrow C.

In FIGS. 2C and 2D, when a positive voltage is applied to the first electrode 151 of the graphene switching device 100 including the semiconductor layer 140 that is a p-type, holes flow over the energy barrier. When a negative voltage is applied to the first electrode 151, holes do not flow well due to the energy barrier. Thus, the graphene switching device 100 functions as a diode. As the gate voltage increases, the amount of the energy barrier is adjusted to be low. Thus, current increases in a direction indicated by an arrow D and thus a diode characteristic may be controlled. In a traditional field effect transistor using a graphene channel, a graphene nanoribbon channel is formed by patterning graphene to form a band gap on a graphene layer, but the graphene channel may be damaged during the patterning process. However, in the graphene switching device 100 including a tunable barrier according to example embodiments, because the semiconductor barrier is arranged between the first electrode 151 and the graphene layer 130, an energy gap may be formed between the first electrode 151 and the graphene layer 130. Because the graphene layer 130 functions as a carrier path only, the width of graphene is not substantially limited when a field effect transistor is embodied using the graphene layer 130. Thus, manufacturing of the field effect transistor including the graphene may be facilitated.

Figure 5:
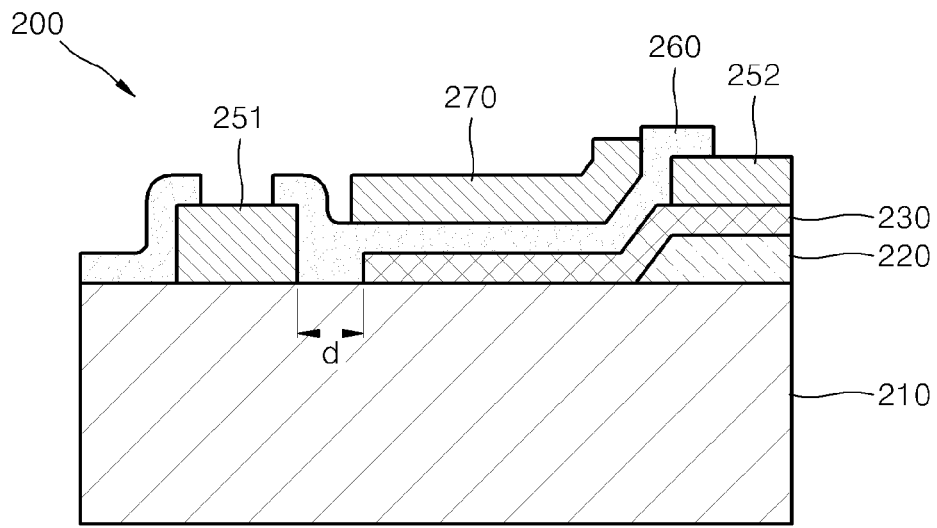
FIG. 5 is a cross-sectional view schematically illustrating a graphene switching device including a tunable barrier having a semiconductor barrier according to example embodiments.

FIG. 5 is a cross-sectional view schematically illustrating a graphene switching device including a tunable barrier having a semiconductor barrier according to example embodiments.

Referring to FIG. 5, a first electrode 251 is arranged in a first region on a substrate 210, and an insulation layer 220 is formed in a second region that is separated from the first region. A graphene layer 230 is formed on the substrate 210 between the first region and the second region, and is separated from the first electrode 251 on the substrate 201 and extended on the insulation layer 220. A separation distance d between the graphene layer 230 and the first electrode 251 may be wide such that tunneling can be possible. Although the separation distance d varies according to a material thereof, the separation distance d may be about 1 nm-about 30 nm. A second electrode 252 is formed in the second region with the graphene layer 230 interposed between the second electrode 252 and the insulation layer 220, to face the insulation layer 220. A gate oxide 260 covering at least the graphene layer 230 is formed on the substrate 210. A gate electrode 270 is formed on the gate oxide 260.

The first electrode 251 and the second electrode 252 may be a source electrode and a drain electrode, or vice versa. The first electrode 251 and the second electrode 252 may be formed of metal or polysilicon.

The substrate 210 is a semiconductor substrate. The semiconductor substrate 210 corresponds to the semiconductor layer 140 of the graphene switching device 100. The semiconductor substrate 210 may be formed of silicon, germanium, silicon-germanium, III-V group semiconductors, II-VI group semiconductors or combinations thereof. The semiconductor substrate 210 may be doped with any one of dopants of n-type impurities or p-type impurities. The semiconductor substrate 210 is arranged to face the gate electrode 270 with the graphene layer 230 interposed therebetween as illustrated in FIG. 5. An energy band of the semiconductor substrate 210 may be affected by the gate voltage.

The gate oxide 260 may be formed of silicon oxide or silicon nitride. The graphene layer 230 may be formed by transferring and patterning graphene that is manufactured by CVD. The graphene layer 230 may include a single layer to four layers of graphene. The graphene layer 230 is a path through which carriers are transferred, and may have a zero band gap.

The graphene switching device 200 including a tunable barrier may be a unipolar transistor that is an n-type transistor or a p-type transistor according to the polarity of the semiconductor substrate 210 that is a semiconductor barrier. That is, when the semiconductor substrate 210 is doped with n-type impurities, the graphene switching device 200 including a tunable barrier becomes an n-type transistor. When the semiconductor substrate 210 is doped with p-type impurities, the graphene switching device 200 including a tunable barrier becomes a p-type transistor.

Because the operation of the graphene switching device 200 including a tunable barrier according to the example embodiments of FIG. 5 is substantially the same as that of the graphene switching device 100 including a tunable barrier according to the example embodiment of FIG. 1, a detailed description thereof will be omitted herein.

In the meantime, the graphene switching device 200 including the semiconductor substrate 210 may function as a diode because the polarity of a voltage flowing in a forward direction is determined according to the doping polarity of the semiconductor substrate 210. Because the amount of an energy barrier is adjusted by the application of the gate voltage, a diode characteristic may be controlled.

Figure 6:
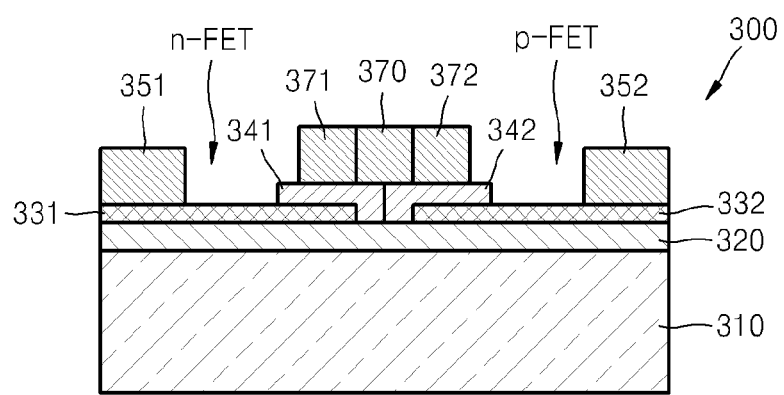
FIG. 6 is a cross-sectional view schematically illustrating a structure of an inverter logic device including two graphene field effect transistors according to example embodiments.
Figure 7:
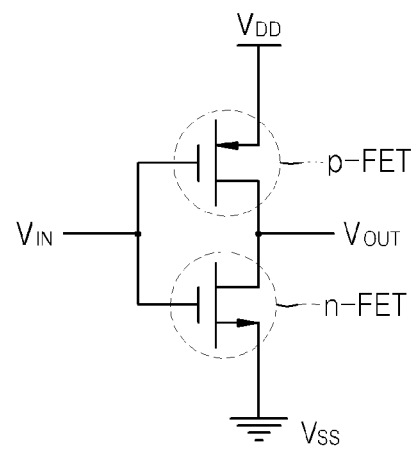
FIG. 7 is an equivalent circuit diagram of the inverter logic device of FIG. 6.

FIG. 6 is a cross-sectional view schematically illustrating a structure of an inverter logic device including two graphene field effect transistors according to example embodiments. FIG. 7 is an equivalent circuit diagram of the inverter logic device of FIG. 6.

Referring to FIGS. 6 and 7, an inverter logic device 300 includes an n-type graphene field effect transistor (n-FET) and a p-type graphene field effect transistor (p-FET). A gate oxide 320 is formed on a substrate 310. A first graphene layer 331 and a second graphene layer 332 are formed on the gate oxide 320 to be separated from each other. The first graphene layer 331 and the second graphene layer 332 may be formed of a single layer to four layers of graphene.

A first electrode 351 is formed in a first region of the first graphene layer 331. A first semiconductor layer 341 is formed in a second region of the first graphene layer 331 that is separated from the first region. A third electrode 371 is formed on the first semiconductor layer 341. The first electrode 351 and the third electrode 371 may be a source electrode and a drain electrode, or vice versa. In the present example embodiments, the first electrode 351 may be a drain electrode, and the third electrode 371 may be a source electrode.

The substrate 310 is a conductive substrate to function as a back gate. The substrate 310 may be formed of a semiconductor substrate doped with impurities or metal.

The first semiconductor layer 341 may be doped with n-type impurities. The substrate 310, the first graphene layer 331, the first electrode 351, and the third electrode 371 constitute an n-FET.

A second electrode 352 is formed in a third region on the second graphene layer 332. A second semiconductor layer 342 is formed in a fourth region on the second graphene layer 332 that is separated from the third region. The second semiconductor layer 342 may be connected to, or formed very close to, the first semiconductor layer 341. A fourth electrode 372 is formed on the second semiconductor layer 342. The fourth electrode 372 may be formed to cover both of the first and second semiconductor layers 341 and 342.

The first and second semiconductor layers 341 and 342 each may have a thickness of about 1 nm-about 10 nm. The second electrode 352 and the fourth electrode 372 may be a source electrode and a drain electrode, or vice versa. In the present example embodiments, the second electrode 352 may be a source electrode and the fourth electrode 372 may be a drain electrode.

Reference numeral 370 denotes an output electrode that is connected to the third electrode 371 and the fourth electrode 372 and that is configured to output an output signal.

Also, the first and second semiconductor layers 341 and 342 may be formed close to each other. The third electrode 371 and the fourth electrode 372 may be a common electrode covering the first and second semiconductor layers 341 and 342. The output electrode 370 may be integrally formed with the third electrode 371 and the fourth electrode 372, and these electrodes may constitute a common electrode.

The second semiconductor layer 342 may be doped with p-type impurities. The substrate 310, the second graphene layer 332, the second electrode 352, and the fourth electrode 372 constitute a p-FET.

The gate oxide 320 may be formed of silicon oxide or silicon nitride.

The first and second graphene layers 331 and 332 may be formed by transferring graphene that is manufactured by CVD onto the substrate 310 and then patterning the graphene. The first and second graphene layers 331 and 332 each may be formed in a single layer to four layers of graphene. The first and second graphene layers 331 and 332 are paths through which carriers are transferred, and may have a zero band gap.

The first and second semiconductor layers 341 and 342 may be formed of silicon, germanium, silicon-germanium, III-V group semiconductors, II-VI group semiconductors or combinations thereof. The first and second semiconductor layers 341 and 342 may have a thickness sufficient for tunneling of carriers. Although the thickness of the first and second semiconductor layers 341 and 342 varies according to a material thereof, the thickness may be about 1 nm-about 10 nm. The first and second semiconductor layers 341 and 342 are arranged to face a gate electrode (substrate 310) with the first and second graphene layers 331 and 332 interposed therebetween as illustrated in FIG. 6. Thus, energy gaps of the first and second semiconductor layers 341 and 342 may be changed by a gate voltage.

Because the operations of the p-FET and the n-FET are substantially the same as that of the above-described graphene switching device 100, detailed descriptions thereof will be omitted herein.

An input voltage $V_{DD}$ is applied to the second electrode 352 that is a source electrode of the p-FET, whereas a source voltage $V_{SS}$ is connected to the first electrode 351 that is a drain electrode of the n-FET. An input voltage $V_{IN}$ is applied to the substrate 310 that is a gate electrode, and an output voltage $V_{OUT}$ is output from the output electrode 370. Thus, the structure of the inverter logic device 300 of FIG. 6 is substantially the same as the circuit diagram of FIG. 7.

Because the inverter logic device 300 according to the present example embodiments includes the p-FET and the n-FET, in each of which an energy gap is easily formed by arranging a semiconductor barrier between the graphene and the electrode instead of patterning the graphene using a nanoribbon to form an energy band gap of the graphene layer, deterioration of yield in the process of forming a graphene nanoribbon channel may be avoided.

Figure 8:
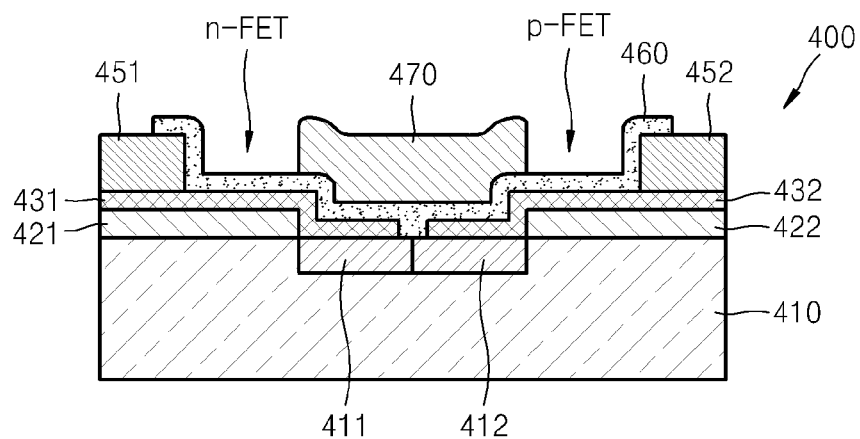
FIG. 8 is a cross-sectional view schematically illustrating a structure of an inverter logic device including two graphene field effect transistors according to example embodiments.

FIG. 8 is a cross-sectional view schematically illustrating a structure of an inverter logic device including two graphene field effect transistors according to example embodiments.

The equivalent circuit diagram of the inverter logic device 400 of FIG. 8 may be substantially the same as the equivalent circuit diagram of FIG. 7.

A first well 411 and a second well 412 are formed on (or recessed within) a semiconductor substrate 410 doped with first impurities. The first well 411 is doped with the first impurities and the second well 412 is doped with second impurities. The first and second impurities are the n-type impurities and the p-type impurities, or vice versa. In the present example embodiments, the first well 411 is doped with the n-type impurities, and the second well 412 is doped with the p-type impurities. Also, the semiconductor substrate 410 is doped with the n-type impurities, and may be doped with the n-type impurities at the same concentration as that of the first well 411, thus there may be no boundary area between the first well 411 and the substrate 410.

A first insulation layer 421 is formed in a first region on the substrate 410 corresponding to the first well 411. A first graphene layer 431 is formed on the first well 411 and the first insulation layer 421. The first graphene layer 431 is formed not to contact the substrate 410. A first electrode 451 is formed on the first graphene layer 431 to face the first insulation layer 421.

A second insulation layer 422 is formed in a second region on the substrate 410 connected to the second well 412. A second graphene layer 432 is formed on the second well 412 and the second insulation layer 422. The second graphene layer 432 does not contact the substrate 410. Also, the second graphene layer 432 is separated from the first graphene layer 431. A second electrode 452 is formed on the second graphene layer 432 to face the second insulation layer 422.

The first well 411 and the second well 412 may be connected to each other. A gate oxide 460 covering the first and second graphene layers 431 and 432 is formed above the first and second wells 411 and 412. A gate electrode 470 is formed on the gate oxide 460 to correspond to the first and second wells 411 and 412.

The first and second wells 411 and 412 correspond to the above-described semiconductor barrier. That is, energy gaps of the first and second wells 411 and 412 may vary according to a gate voltage applied to the gate electrode 470. The first electrode 451, the first graphene layer 431, the first well 411, and the gate electrode 470 constitute an n-FET. The second electrode 452, the second graphene layer 432, the second well 412, and the gate electrode 470 constitute a p-FET. The gate oxide 460 may be formed of silicon oxide or silicon nitride.

The first and second graphene layers 431 and 432 may be formed by transferring graphene that is manufactured by CVD onto the substrate 410 and then patterning the graphene. The first and second graphene layers 431 and 432 each may be formed in a single layer to four layers of graphene. The first and second graphene layers 431 and 432 are paths through which carriers are transferred, and may have a zero band gap.

The semiconductor substrate 410 may be formed of silicon, germanium, silicon-germanium, III-V group semiconductors, II-VI group semiconductors or combinations thereof. The first and second wells 411 and 412 may have a thickness sufficient for tunneling of carriers. Although the thickness varies according to a material thereof, the thickness may be about 1 nm-about 10 nm. The first and second wells 411 and 412 are arranged to face the gate electrode 470 with the first and second graphene layers 431 and 432 interposed therebetween as illustrated in FIG. 8. Thus, energy gaps of the first and second wells 411 and 412 may be changed by a gate voltage.

Because the operations of the p-FET and the n-FET are substantially the same as that of the above-described graphene switching device 100, detailed descriptions thereof will be omitted herein.

In comparison of the structure of FIG. 8 with the equivalent circuit diagram of the inverter logic device of FIG. 7, the first electrode 451 corresponds to a drain electrode of the n-FET and the second electrode 452 corresponds to a source electrode of the p-FET. An input voltage $V_{DD}$ is applied to the second electrode 452, whereas a source voltage $V_{SS}$ is connected to the first electrode 451. An input voltage $V_{IN}$ is applied to the gate electrode 470 and an output voltage $V_{OUT}$ is output from the semiconductor substrate 410. Thus, the structure of the inverter logic device 400 of FIG. 8 is substantially the same as the circuit diagram of FIG. 7.

As described above, the inverter switching device includes a graphene field effect transistor having a tunable barrier according to the above-described example embodiments, because an energy gap is formed between the electrode and the graphene channel as a semiconductor barrier, the width of a graphene channel is not substantially restricted. Thus, a defect of graphene generated when a graphene nanoribbon channel is formed during the graphene patterning process may be avoided.

It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:

1. An inverter logic device, comprising:
a gate oxide on a back gate substrate;
a first graphene layer and a second graphene layer physically separated from each other by a gap on the gate oxide;
a first electrode layer and a first semiconductor layer on a same surface of the first graphene layer and separated from each other;
a second electrode layer and a second semiconductor layer on a same surface of the second graphene layer and separated from each other, wherein the first semiconductor layer is doped with a different type impurities selected from n-type impurities and p-type impurities than the second semiconductor layer;
a third electrode on the first semiconductor layer overlapping the first graphene layer;
a fourth electrode on the second semiconductor layer overlapping the second graphene layer; and
an output electrode connected to the third electrode and the fourth electrode,
wherein the first semiconductor layer faces the back gate substrate with the first graphene layer therebetween, and the second semiconductor layer faces the back gate substrate with the second graphene layer therebetween.

2. The inverter logic device of claim 1, wherein the first semiconductor layer and the second semiconductor layer are connected to each other or arranged close to each other, and the third electrode and the fourth electrode are integrally formed as a common electrode on the first semiconductor layer and the second semiconductor layer.

3. The inverter logic device of claim 2, wherein the output electrode is integrally connected to the common electrode.

4. The inverter logic device of claim 1, wherein the first graphene layer and the second graphene layer are respectively separated from the third electrode and the fourth electrode.

5. The inverter logic device of claim 1, wherein each of the first semiconductor layer and the second semiconductor layer includes one selected from the group consisting of silicon, germanium, silicon-germanium, III-V group semiconductors, II-VI group semiconductors and combinations thereof.

6. The inverter logic device of claim 1, wherein each of the first semiconductor layer and the second semiconductor layer has a thickness of about 1 nm-about 10 nm.

7. The inverter logic device of claim 1, wherein energy gaps of the first semiconductor layer and the second semiconductor layer vary according to a gate voltage applied to the back gate substrate.

8. The inverter logic device of claim 1, wherein the inverter logic device includes n-type transistor having one of the first semiconductor and the second semiconductor having n-type impurities and p-type transistor having the other of the first semiconductor and the second semiconductor having p-type impurities.

* * * * *